(12) United States Patent
Donahue et al.

(10) Patent No.: US 6,903,809 B2
(45) Date of Patent: Jun. 7, 2005

(54) INTEGRATED, IN-LINE BUMPING AND EXPOSURE SYSTEM

(75) Inventors: Joseph P. Donahue, Oro Valley, AZ (US); Norman L. Shaver, Tucson, AZ (US)

(73) Assignee: PerkinElmer, Inc., Wellesley, MA (US)

( * ) Notice: Subject to any disclaimer, the term of this patent is extended or adjusted under 35 U.S.C. 154(b) by 0 days.

(21) Appl. No.: 10/853,539

(22) Filed: May 25, 2004

(65) Prior Publication Data

US 2005/0011382 A1 Jan. 20, 2005

Related U.S. Application Data

(60) Provisional application No. 60/474,185, filed on May 29, 2003.

(51) Int. Cl.$^7$ .............................................. G03B 27/04
(52) U.S. Cl. .......................................... 355/85; 355/89
(58) Field of Search ............................. 355/85, 89, 97, 355/99, 100; 101/453, 463.1

(56) References Cited

U.S. PATENT DOCUMENTS

| | | | | |
|---|---|---|---|---|
| 5,455,416 A | * | 10/1995 | Zertani et al. | 250/215 |
| 5,892,574 A | * | 4/1999 | Powers et al. | 355/85 |
| 6,262,825 B1 | * | 7/2001 | Mueller et al. | 359/196 |

* cited by examiner

*Primary Examiner*—Rodney Fuller
(74) *Attorney, Agent, or Firm*—Carmody & Torrance LLP

(57) ABSTRACT

An integrated, in-line bumping and exposure system for printing plates or other substrates having a photosensitive layer. A linear illumination source or sources are for bumping the photosensitive material with a band of illumination to consume dissolved oxygen within the photosensitive layer. A raster scan optical assembly or an illuminated and re-imaged spatial light modulator array exposes the photosensitive material with a rasterized beam or beams or an array of modulated electromagnetic radiation located downstream of the bumping illumination. A conveyance mechanism is configured to provide relative continuous motion between one or more substrates and the bands of illumination to continuously bump and pattern one portion of the plate or plates while the other portion of the plate or plates is bumped in anticipation of patterning.

51 Claims, 12 Drawing Sheets

INTEGRATED, IN-LINE BUMPING AND EXPOSURE SYSTEM

RELATED APPLICATIONS

This application claims priority from U.S. Provisional Application Ser. No. 60/474,185 filed May 29, 2003.

FIELD OF THE INVENTION

This invention relates to an integrated, in-line bumping and exposure system for printing plates or other substrates having a photosensitive layer.

BACKGROUND OF THE INVENTION

Printing plates such as flexographic (flexo) plates coated with a photopolymer resin layer are typically digitally imaged or patterned using a modulated and rasterized laser beam or beams, or an array of light produced by an illuminated and re-imaged spatial light modulator array, in a machine such as a computer-to-plate (CTP) exposure system. Most flexo plates are not manufactured in an oxygen-free environment and are not overcoated with an oxygen barrier layer such as polyvinyl alcohol. In addition, oxygen-contaminated components are distributed throughout the photopolymer. In this case, there is an abundance of dissolved oxygen throughout the photosensitive resin that inhibits photopolymerization. And, if oxygen is removed from such a flexo plate, ambient oxygen will diffuse back into the resin.

The third dimension of the exposed and developed flexo plate, especially the sidewall slope of a patterned feature, is a critical determinant of exposed image quality. For an isolated dot on such a plate, a wide base and a narrow flat top are preferred. This is achieved with conventionally exposed ultraviolet sensitive photopolymer resins by first "bumping" the plate, i.e., uniformly flooding the entire plate with ultraviolet light to photometrically consume the dissolved oxygen throughout the resin, followed by exposing with patterned light to polymerize selected features on the plate. The exposed plate is chemically developed, leaving a residual image of polymerized resin attached to the plate substrate. The bumping process initiates a chemical reaction in the unexposed plate with a time constant that in thick flexographic resins has been measured in several seconds. Immediately after the bump is applied, ambient oxygen begins to diffuse back into the plate from the surface. This leads to a higher oxygen concentration in the resin closer to the surface (top of plate) than to the substrate (bottom of plate) so that photopolymerization inhibition is greater near the surface. Thus, when the patterning exposure is performed, the dot base is more polymerized than the top resulting in a wider base and a narrower top.

For a successful flexo CTP system, it is necessary to tailor the oxygen concentration throughout the resin cross section with a pre-exposure system that adjusts the bump irradiance and the elapsed time from the bump until the patterning exposure.

It is well known to pre-expose the whole printing plate using a separate bumping station comprising an ultraviolet or near-ultraviolet source and then to transfer the printing plate to a conventional film-based exposure system or a maskless CTP exposure system for patterning. This method works well for a flood bump exposure combined with a flood pattern exposure but fails when the bump simultaneously exposes the full plate area followed by a pattern exposure of the plate one section at a time. Thus, the best exposure performance and exposure latitude occurs when the delay between the bump and the patterning is nearly constant at all locations on the flexo plate.

U.S. Pat. No. 5,455,416, incorporated herein by this reference, discloses a preexposure device wherein a linear LED arrangement preexposes a printing plate traveling on a conveyer under the device. When and how the printing plate is then subjected to full exposure, however, is not disclosed in the '416 Patent.

In U.S. Pat. No. 6,262,825, also incorporated herein by this reference, an apparatus is disclosed in which a beam of laser radiation is split to provide the patterning exposing beam which trails the "pre-exposing" beam to limit the time period between the bumping and the pattern exposure process. In some respects, the "pre-exposing" laser beam can be thought of as wasted laser power due to the requirement of a more powerful laser than is required only for pattern exposure.

Furthermore, U.S. Pat. No. 6,262,825 teaches only a single backscan (bump) beam in advance of the imaging (patterning) beam. In the case of flexographic platemaking, a minimum delay is required to permit the process of photometric consumption of oxygen to reach chemical equilibrium. This defines a minimum temporal separation between the backscan and the imaging beam. However, too large a temporal separation results in an excessive amount of oxygen that diffuses back into the top layer of the resin. For high-speed plate imaging, a single backscan beam does not easily satisfy these two boundary conditions and can result in a small or non-existent exposure process window. However, two backscan beams or two bands of illumination, one that delivers a large dose to consume the oxygen dissolved throughout the flexo resin followed many seconds later by the other beam or band of illumination that delivers a smaller dose to consume the oxygen that has re-dissolved into the flexo resin top surface, have the potential to better tailor the oxygen concentration throughout the resin cross section.

BRIEF SUMMARY OF THE INVENTION

It is therefore an object of this invention to provide a system and method for an integrated, in-line bumping and exposure technique for plate having a photosensitive layer.

It is a further object of this invention to provide such a system and method which permits the use of a low cost optical exposure source for bumping thereby conserving potentially expensive optical power for the pattern exposure process.

It is a further object of this invention to provide such a system and method which is faster than prior art computer-to-plate (CTP) machines.

It is a further object of this invention to provide such a system and method which can be used in connection with systems other than CTP machines.

It is a further object of this invention to provide such a system and method which ensures the maximum amount of dissolved oxygen in a photopolymer substrate is consumed but also ensures that oxygen diffused back into the top layer of the photopolymer resin is also consumed.

This invention results from the realization that an imaged or non-imaged linear ultraviolet or near-ultraviolet lamp or light emitting diode (LED) array provides an acceptable and low cost method of photometrically consuming the dissolved oxygen within a photopolymer coated substrate as part of an in-line CTP system where the printed image is subsequently patterned by a modulated and rasterized laser beam or beams, or an array of light produced by an illuminated and re-imaged spatial light modulator array. The subject invention results from the further realization that the photochemical kinetics of the bumping process dictate in-line plate transfer system exposure methodologies that accommodate the requisite delay between the bump exposure and the pattern exposure. The subject invention also results from the realization that the bumping methodology is preferably matched to the patterning methodology to achieve a constant or near-constant delay between the bump and the pattern exposures required for best image quality.

This invention features an integrated, in-line bumping and exposure system for printing plates or other substrates having a photosensitive layer. In one embodiment, the system includes a linear illumination source for bumping the photosensitive material with a band of illumination to consume the dissolved oxygen within the photosensitive layer. An exposure module such as a raster scan optical assembly or an illuminated and re-imaged spatial light modulator array exposes the photosensitive material with a rasterized beam or beams or a spatially modulated array of electromagnetic radiation located downstream of the band of bumping radiation. A conveyance mechanism is configured to provide relative motion between the plate, the bump band of illumination, and the rasterized beam(s) or array of modulated electromagnetic radiation to continuously bump one portion of the plate and pattern the bumped portion of the plate while another portion of the plate is being bumped.

In another embodiment, the system includes linear illumination sources for bumping the photosensitive material with bands of illumination to consume the dissolved oxygen within the photosensitive layer. A raster scan optical assembly or an illuminated and re-imaged spatial light modulator array exposes the photosensitive material with a rasterized beam or beams or an array of modulated electromagnetic radiation located downstream of the bands of bumping radiation. A conveyance mechanism is configured to provide relative motion between the plate, the bump bands of illumination, and the rasterized beam(s) or array of modulated electromagnetic radiation to continuously bump one portion of the plate followed by a second bumping and patterning of the bumped portion of the plate while another portion of the plate is receiving its first bump.

In another embodiment, the system includes linear illumination sources for bumping the photosensitive material on two or more substrates with bands of illumination to consume the dissolved oxygen within the photosensitive layer. A raster scan optical assembly or an illuminated and re-imaged spatial light modulator array exposes the photosensitive material with a rasterized beam or beams or an array of modulated electromagnetic radiation located downstream of the bands of bumping radiation. A conveyance mechanism is configured to provide relative motion between the substrates, the bump bands of illumination, and the rasterized beam(s) or array of modulated electromagnetic radiation to continuously bump one plate followed by a second bumping and patterning of the bumped portion of the plate while another plate is receiving its first bump.

The illumination source is typically a source of ultraviolet or near ultraviolet radiation having a wavelength of between 244 nm and 436 nm. In one example, the illumination source includes a linear lamp at a focal point of a concave reflector. Further included may be a shutter assembly for selectively blocking or electronically masking some or all of the output of the lamp. One conveyance mechanism includes a platen which moves the plate under the linear illumination source and the raster scan assembly or an illuminated and re-imaged spatial light modulator array.

In another example, the illumination source includes an LED array wherein the rows of LEDs are staggered. Typically, a diffusing mechanism such as a lenticular lens spatially integrates the fluence of the array in one dimension while the relative motion of the plates with respect to the bump spatially integrates the fluence in the orthogonal dimension. Also, it is preferred that the lenticular lens is oriented to have a minimum of optical power in the direction of relative motion.

Preferably, the conveyance mechanism operates at a continuous speed sufficient to effect exposing of the image no sooner than 2–20 seconds after and no later than 10–100 seconds after the start of the bump. Also, the width of the bump illumination beam is preferably greater than or equal to the width of the scan lines provided by the rasterized beam or beams or the area exposed by the imaged spatial light modulator.

This invention also features a method of enhancing the exposure of photosensitive material, the method comprising providing a band of illumination sufficient to consume dissolved oxygen within the photosensitive material, providing a rasterized beam or beams or an array of modulated electromagnetic radiation downstream of the band of bump illumination to image the material, providing relative motion between the material and the band of bumping illumination and the rasterized beam or beams or an array of modulated electromagnetic radiation, and bumping one portion of the plate with the band of bumping illumination and patterning the bumped portion of the plate with the rasterized beam or beams or an array of modulated electromagnetic radiation while another portion of the plate is being bumped.

Another method to enhance the exposure of photosensitive material comprises providing bands of illumination sufficient to consume dissolved oxygen within the photosensitive material, providing a rasterized beam or beams or an array of modulated electromagnetic radiation downstream of the bands of bump illumination to image the material, providing relative motion between the material and the bands of bumping illumination and the rasterized beam or beams or an array of modulated electromagnetic radiation, and bumping one of the plates with a band of bumping illumination followed by a second bumping and patterning of the bumped portion of the plate with the rasterized beam(s) or array of modulated electromagnetic radiation while exposing another portion of the plate with a band of bumping illumination for its first bump.

Another method to enhance the exposure of photosensitive material comprises providing bands of illumination sufficient to consume dissolved oxygen within the photosensitive material, providing a rasterized beam or beams or an array of modulated electromagnetic radiation downstream of the bands of bump illumination to image the photosensitive material on two or more substrates, providing relative motion between the substrates and the bands of bumping illumination and the rasterized beam or beams or an array of modulated electromagnetic radiation, and exposing one plate with a band of bumping illumination followed by a second bumping and patterning with the rasterized beam(s) or array of modulated electromagnetic radiation of the bumped portion of the plate while another plate is receiving its first bump.

In the preferred embodiment, the band of illumination is typically ultraviolet or near ultraviolet having a wavelength of between 244 nm and 436 nm. In one example, the band of illumination originates from a linear lamp at a focal point of a concave reflector and there is a shutter assembly for selectively blocking or electronically masking some or all of the output of the lamp. In another example, the band of illumination originates from an LED array. Typically, the rows of LEDs are staggered and the LED illumination is diffused by a lenticular lens. The lenticular lens is preferably oriented to have a minimum of optical power in the direction of relative motion. In another example, an imaging lens images the linear lamp or LED array through a mechanical or electronic mask and projects the image onto the substrate to create a band of illumination with sharp edges with little or no light imaged outside the boundary defined by the sharp edges.

An integrated, in-line bumping and exposure system for printing plates or other substrates having a photosensitive layer in accordance with this invention includes a linear lamp typically producing ultraviolet or near ultraviolet radiation having a wavelength of between 244 nm and 436 nm, a raster scan optical assembly or an illuminated and re-imaged spatial light modulator array for exposing the photosensitive material with a rasterized beam or beams or an array of modulated electromagnetic radiation located downstream of the band of bumping radiation, and a conveyance mechanism configured to provide relative motion between the plate, the bump band of illumination, and the rasterized beam(s) or array of modulated electromagnetic radiation to continuously bump one portion of the plate and pattern the bumped portion of the plate while another portion of the plate, or another plate, is being simultaneously bumped.

Another integrated, in-line bumping and exposure system for printing plates or other substrates having a photosensitive layer features an LED array with rows of staggered LEDs and a diffusing mechanism for bumping the photosensitive material with a band of illumination to consume dissolved oxygen within the photosensitive layer, a raster scan optical assembly or an illuminated and re-imaged spatial light modulator array for exposing the photosensitive material with a rasterized beam or beams or an array of modulated electromagnetic radiation located downstream of the band of bumping radiation, and a conveyance mechanism configured to provide relative motion between the plate, the bump band of illumination, and the rasterized beam(s) or array of modulated electromagnetic radiation to continuously bump one portion of the plate and pattern the bumped portion of the plate while another portion of the plate, or another plate, is being simultaneously bumped.

Another integrated, in-line bumping and exposure system for printing plates or other substrates having a photosensitive layer features an illuminated mechanical or electro-optical mask imaged onto the substrate to create an illumination band with sharply defined edges for bumping the photosensitive material to consume dissolved oxygen within the photosensitive layer, a raster scan optical assembly or an illuminated and re-imaged spatial light modulator array for exposing the photosensitive material with a rasterized beam or beams or an array of modulated electromagnetic radiation located downstream of the band of bumping radiation, and a conveyance mechanism configured to provide relative motion between the plate, the bump band of illumination, and the rasterized beam(s) or array of modulated electromagnetic radiation to continuously bump one portion of the plate and pattern the bumped portion of the plate while another portion of the plate, or another plate, is being simultaneously bumped.

Another integrated, in-line bumping and exposure system for printing plates or other substrates having a photosensitive layer features an illumination source for bumping the photosensitive material with a band of illumination to consume dissolved oxygen within the photosensitive layer, an imaging optical assembly for exposing the photosensitive material with a rasterized beam or beams or an array of modulated electromagnetic radiation located downstream of the band of bumping radiation, and a conveyance mechanism configured to provide constant relative motion between the plate, the bump band of illumination, and the rasterized beam(s) or array of modulated electromagnetic radiation to continuously bump one portion of the plate and pattern the bumped portion of the plate while another portion of the plate, or another plate, is being simultaneously bumped.

Another integrated, in-line bumping and exposure system for printing plates or other substrates having a photosensitive layer features a rectangular illumination source for bumping the photosensitive material with a band of illumination to consume dissolved oxygen within the photosensitive layer, an imaging optical assembly for exposing the photosensitive material with a rasterized beam or beams or an array of modulated electromagnetic radiation located downstream of the band of bumping radiation, and a conveyance mechanism configured to provide a stepped relative motion between the plate, the bump band of illumination, and the rasterized beam(s) or array of modulated electromagnetic radiation to piecewise bump one portion of the plate and pattern the bumped portion of the plate while another portion of the plate, or another plate, is being simultaneously piecewise bumped.

One preferred method of enhancing exposure of photosensitive material on a plate comprises bumping a first portion of the plate with a band of primary bumping illumination sufficient to consume any dissolved oxygen within the photosensitive material, bumping said first portion of the plate with a band of secondary bumping illumination sufficient to consume oxygen re-diffused within the photosensitive material after the primary bump, and imaging the first portion to expose it. A second portion of the plate may be bumped with the band of primary bumping illumination while first portion of the plate is subjected to secondary bump and imaging. Preferably, the time between imaging and the primary bump is much greater than the time between imaging and the secondary bump. The time between the primary bump and the secondary bump is typically greater than 10 seconds. In one embodiment, the primary and the secondary bump illumination are produced by the same illumination source such as an LED array. The band of primary bumping illumination typically has an optical power greater than the band of secondary bumping illumination.

One in-line bumping and exposure system for plates having a photosensitive layer in accordance with this invention comprises a source of primary bumping radiation for bumping the photosensitive material to consume any dissolved oxygen within the photosensitive layer, a source of secondary bumping radiation for bumping the photosensitive material to consume oxygen re-diffused within the photosensitive material, a source for exposing the photosensitive material, and a mechanism for providing relative motion between a plate and the source of primary bumping radiation, the source of secondary bumping radiation, and the exposure source.

In one example, the source of primary bumping radiation and the source of secondary bumping radiation is an LED array. Typically, the optical power of the primary bumping radiation is greater than the source of secondary bumping radiation.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Figure 1A:
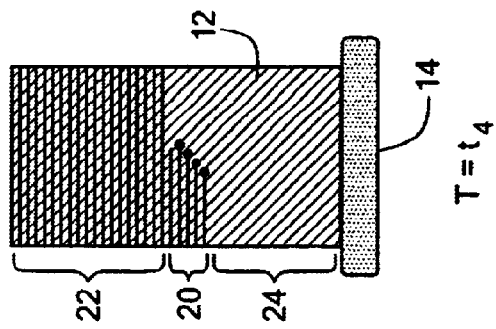
FIGS. 1A–1E are schematic top views showing snap shots in time for the steps carried out in accordance with one method in accordance the subject invention.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings.

In accordance with one method of and system for the subject invention, printing plate 12, FIG. 1A, such as a flexographic plate with a photosensitive top layer is bumped by producing a band of illumination 14 across the top layer to consume any dissolved oxygen within the top photosensitive layer. Band of illumination 14 is preferably ultraviolet or near ultraviolet radiation in the range of 244–436 nm, depending upon the absorption characteristics of the resin and is produced by an ultraviolet or near ultraviolet lamp or an array of ultraviolet or near ultraviolet producing LEDs as discussed infra.

Figure 1B:
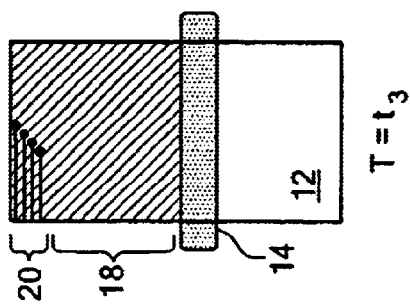
Figure 1C:
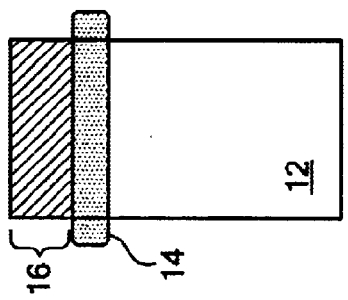

As shown in FIGS. 1B–1C, a conveyance mechanism moves plate 12 beneath band of illumination 14 to bump portion 16 of plate 12. Thus, at time $T=t_0$ (FIG. 1A) bumping of portion 16 has not yet begun, at time $T=t_1$ (FIG. 1B) bumping of portion 16 has just begun, and at time $T=t_2$ (FIG. 1C) portion 16 has been bumped. Next, at time $T=t_3$ (FIG. 1D), an optical imaging assembly begins exposing the bumped photosensitive top layer of plate 12 with a modulated and rasterized beam or beams of electromagnetic energy 20, or an array of light produced by an illuminated and re-imaged spatial light modulator array, located downstream of the band of bumping radiation 14.

Figure 1D:
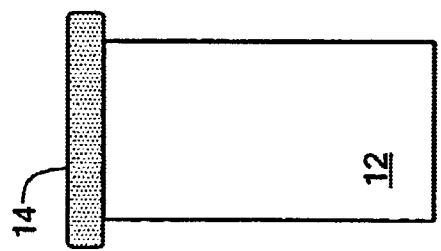
Figure 1E:
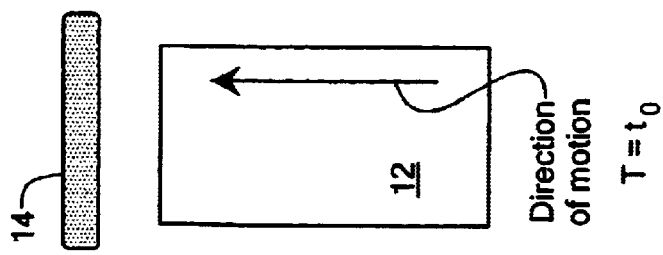

Thus, part or all of bumped region or area 16 is being imaged in FIG. 1D while adjacent bumped region 18 was produced in the transition from FIG. 1C to FIG. 1D. The length of region 18 is determined by the requisite time delay to permit the process of photometric consumption of oxygen to reach chemical equilibrium. For best image quality, the delay between the start of the bump and the start of the pattern exposures, a time approximately equal to $t_3$ minus $t_1$, must typically exceed 2–20 seconds and must typically not exceed 10–100 seconds, dependent upon the resin formulation and/or thickness. It is often necessary to provide a minimum amount of time to reach equilibrium, but waiting too long will allow ambient oxygen to dissolve back into the resin. Also, the delay should be constant for all portions of the flexo plate to achieve optimum exposure performance, latitude, and consistency for all portions of the plate. Continuous processing is continued in this fashion as shown in the transition from FIG. 1D to FIG. 1E where next adjacent portion 24 of the plate has just been bumped while part or all of portion 18 is being imaged during portion 20 as shown in FIG. 1E at time $T=t_4$ and portion 22 has been bumped and imaged.

As explained above, if the exposure occurs too quickly after bumping, equilibrium will not have occurred. Also, if the exposure occurs too long after bumping equilibrium, oxygen will again have diffused into the resin.

Figure 2C:
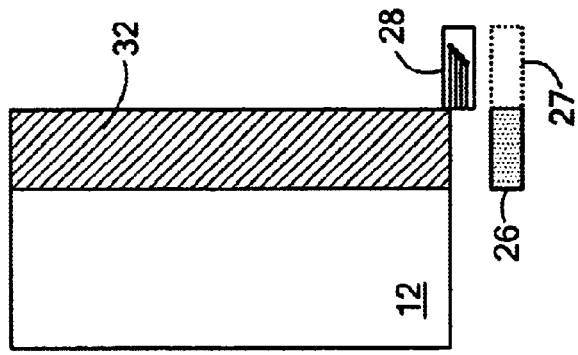
FIGS. 2A–2E are schematic top views showing snap shots in time for the steps carried out in accordance with another method in accordance with the subject invention.
Figure 2B:
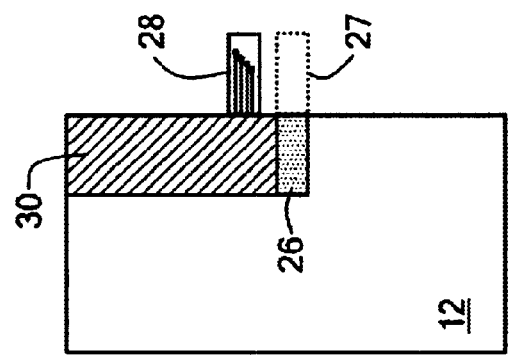
Figure 2A:
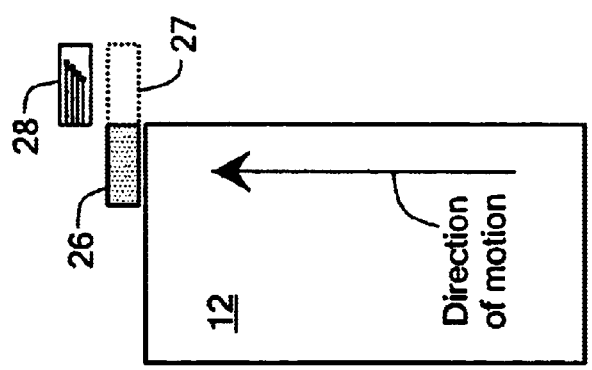

Thus, in accordance with another preferred method, FIGS. 2A through 2L illustrate the bumping and patterning of a printing plate larger than the bump band of illumination. It also illustrates a method for applying a primary and secondary bump where the primary bump consumes bulk oxygen dissolved throughout the flexo plate and the secondary bump, applied after the built-in delay and just before the pattern exposure, consumes oxygen that has penetrated the top layer of the resin. This process can be thought of as a fine-tuning of the oxygen profile to obtain the best exposed feature profile. In FIG. 2A, a conveyance mechanism moves plate 12 beneath the rectangular shaped primary bump band of illumination 26. This band of illumination preferably has very sharp edges and may be formed by imaging a laser beam or beams or an illuminated mechanical or electro-optical mask onto the plate surface 12. Adjacent to the band of illumination 26 is an optional secondary bump band of illumination 27. While band of illumination 26 performs the primary bump typically no less than 2–20 and typically no more than 10–100 seconds before the pattern exposure, band of illumination 27 performs an optional secondary bump prior to the pattern exposure. Following secondary bump band of illumination 27 by a short distance, typically from 0.1 to 6.0 inches of separation in the direction of motion of plate 12, is band of illumination 28. This is the area or region of patterned fluence impinging upon the plate surface 12 created by a modulated and rasterized beam or beams of electromagnetic energy, or an array of light produced by an illuminated and re-imaged spatial light modulator array.

Figure 2F:
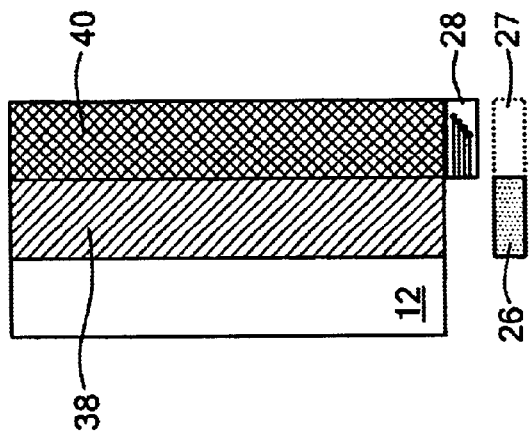
Figure 2E:
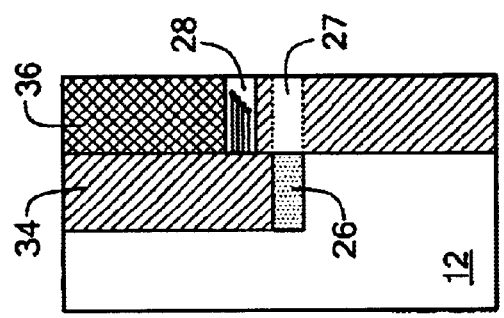
Figure 2D:
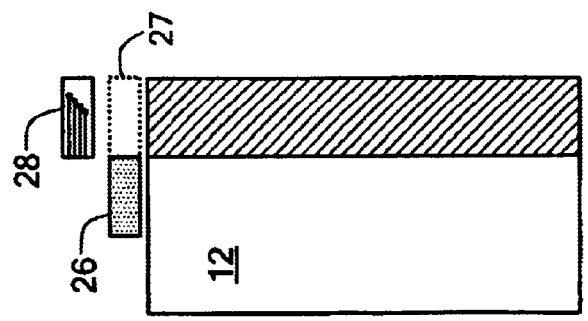
Figure 2I:
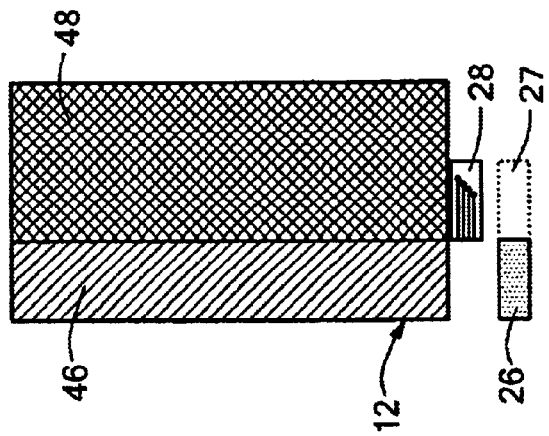
Figure 2H:
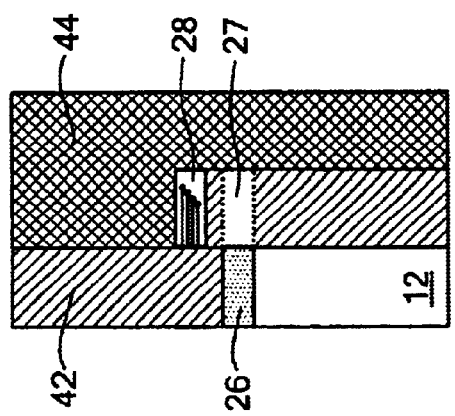
Figure 2G:
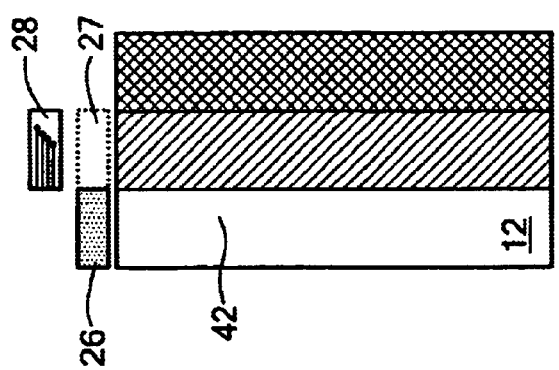
Figure 2L:
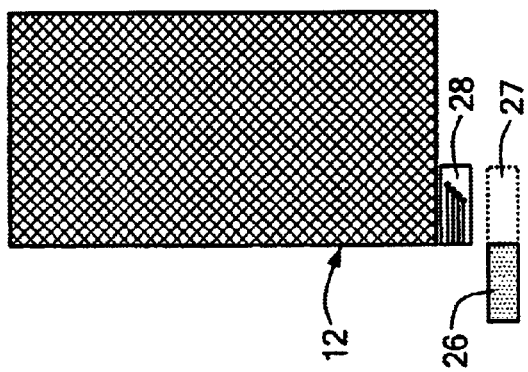
Figure 2K:
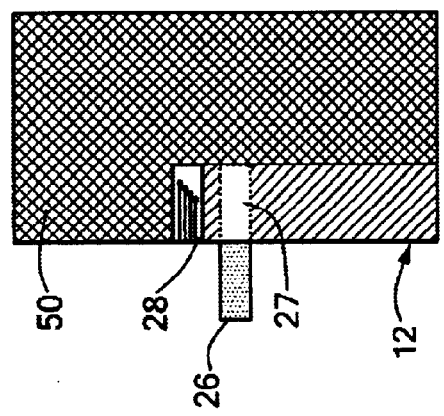
Figure 2J:
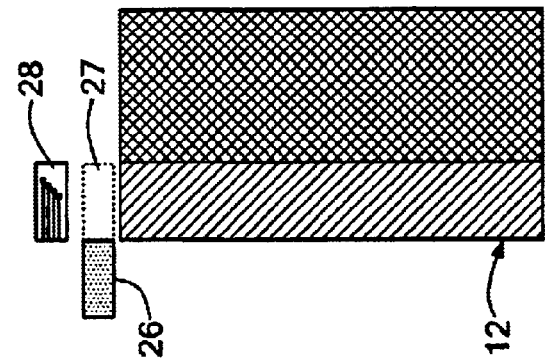

As shown in FIGS. 2A–2B, the conveyance mechanism moves plate 12 underneath primary bump band of illumination 26 and bumps portion 30 (FIG. 2B) while proceeding to bump the entire stripe segment 32, FIG. 2C. In FIG. 2C, the entire stripe segment 32 has been bumped. In FIG. 2D, either the plate 12 or the bands of illumination 26–28 are indexed to the adjacent unbumped stripe 38. In FIG. 2E, the conveyance mechanism moves plate 12 underneath the bands of illumination 26–28 and stripe 38, portion 34 is bumped underneath band of illumination 26 while stripe 40, portion 36 is exposed with a secondary bump (from 0% to 100% of the fluence of the primary bump depending upon the rate of oxygen rediffusion into the flexo resin) underneath band of illumination 27 and shortly thereafter patterned underneath band of illumination 28. In FIG. 2F, the entire stripe segment 38 has been primary bumped and the entire stripe segment 40 has been secondary bumped and then patterned with the primary exposure energy. In FIG. 2G, the plate 12 or the bands of illumination 26–28 are indexed to the adjacent unbumped stripe segment 42 and the adjacent bumped stripe segment 44. In FIG. 2H, the conveyance mechanism moves plate 12 underneath the bands of illumination 26–28 and stripe segment 46, portion 42 is bumped underneath primary bump band of illumination 26 while stripe 48, portion 44 is bumped underneath band of illumination 26 while stripe 46 portion 44 is exposed with a secondary bump (from 0% to 100% of the fluence of the primary bump depending upon the rate of oxygen rediffusion into the flexo resin) underneath band of illumination 27 and shortly thereafter patterned underneath band of illumination 28. In FIG. 2L the entire stripe segment 46 has been bumped and the entire stripe segment 48 has been patterned with the primary exposure energy. In FIG. 2J, the plate 12 or the bands of illumination 27–28 are indexed to the adjacent bumped stripe segment 52. In FIG. 2K, the conveyance mechanism moves plate 12 underneath the band of llumination 27 and stripe segment 52, portion 50 is exposed with a secondary bump (from 0% to 100% of the fluence of the primary bump depending upon the rate of oxygen rediffusion into the flexo resin) and shortly thereafter patterned underneath band of illumination 28. In FIG. 2L the entire stripe segment 46 has been bumped and the entire stripe segment 46 has been patterned. Larger plates are exposed by means of additional bumping and patterning segments.

Figure 3A:
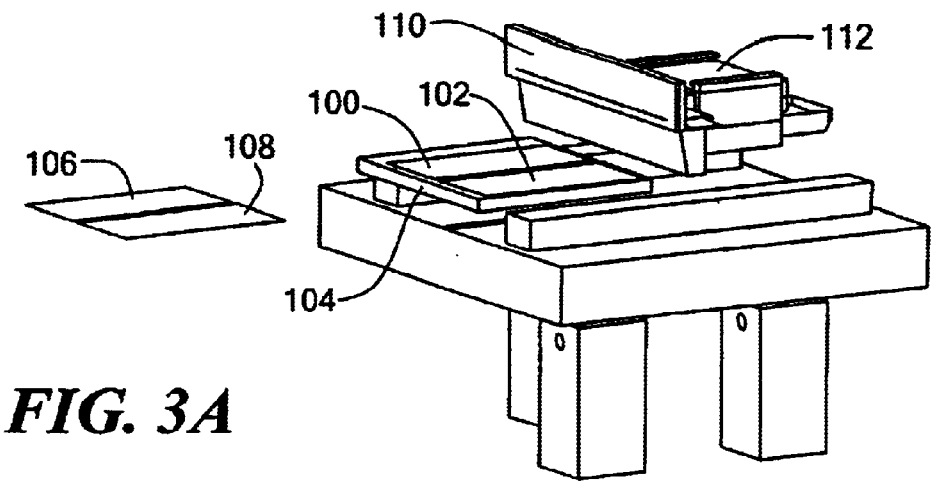
FIGS. 3A–3G are three dimensional schematic views showing snap shots in time for the steps carried out in accordance with the preferred method of the subject invention for a CTP system capable of exposing side-by-side printing plates.
Figure 3B:
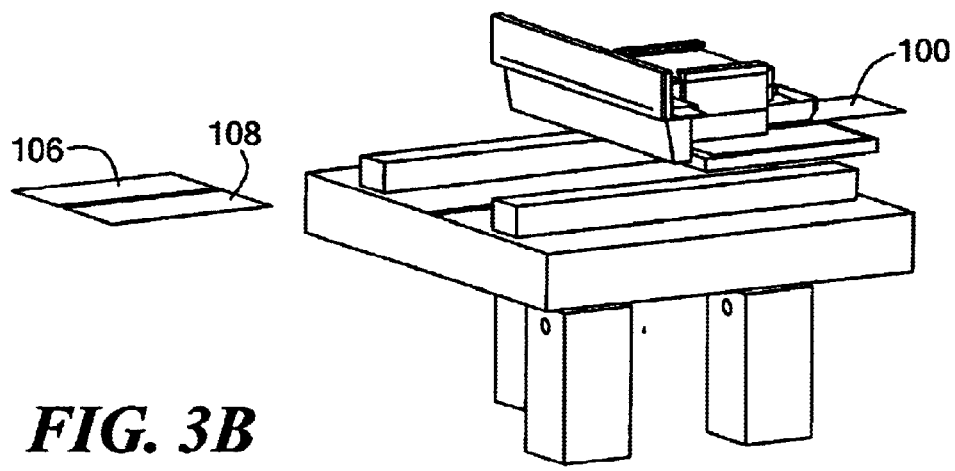
Figure 3C:
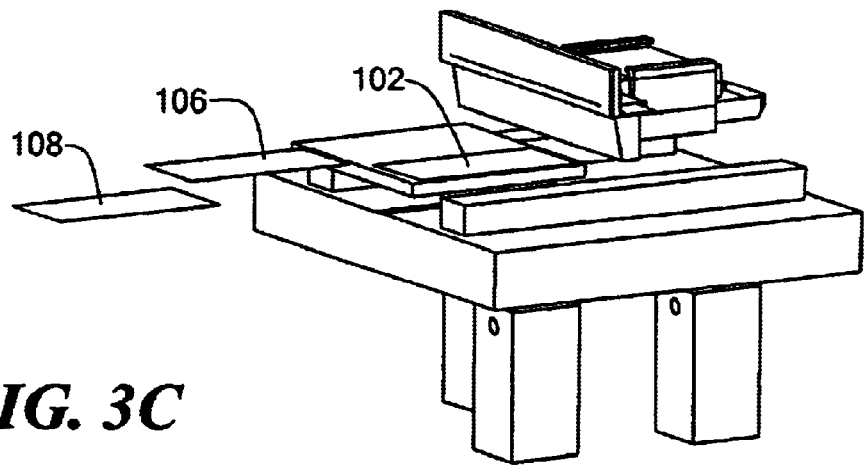
Figure 3D:
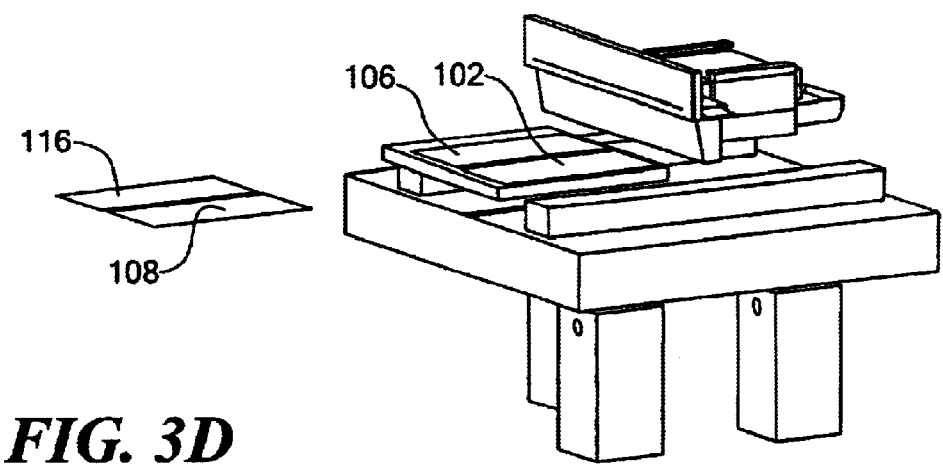
Figure 3E:
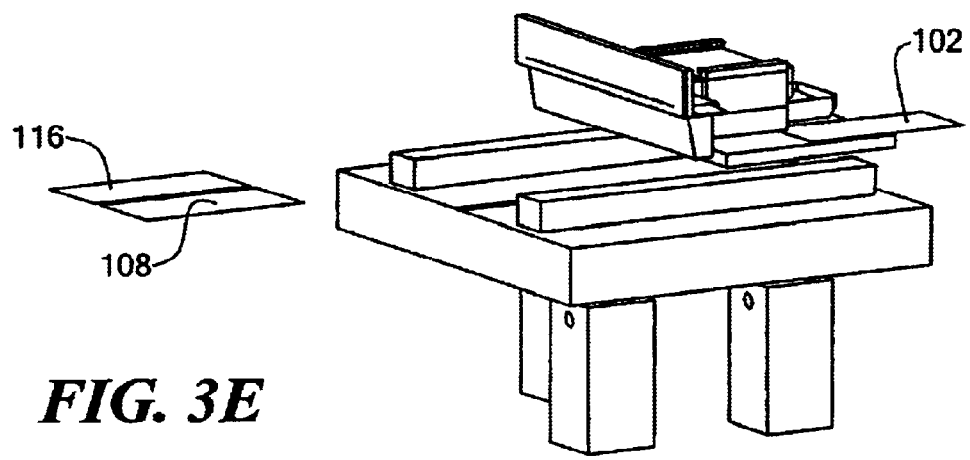
Figure 3F:
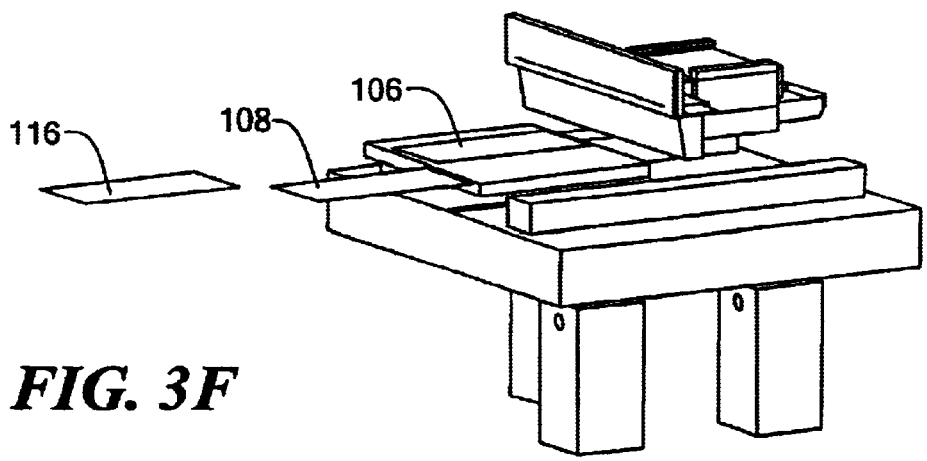
Figure 3G:
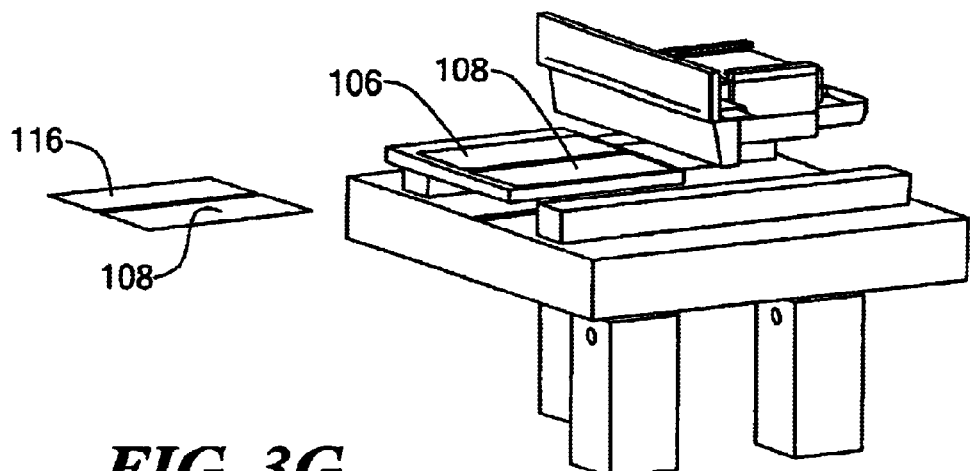

In accordance with one method and system for the subject invention, FIGS. 3A through 3G illustrate the preferred steps for bumping and patterning side-by-side printing plates in a typical newspaper CTP system. In FIG. 3A, two unexposed printing plates 100 and 102 rest on the vacuum platen 104 while two unexposed plates 106 and 108 are in the queue waiting to be transferred to the exposure station. After placement on platen 104, plates 100 and 102 are transferred beneath the bump produced by bump optics 110 and raster scan bands of illumination at a continuous velocity produced by laser raster output scanner 112. Other exposure modules for exposing the photosensitive material with electromagnetic radiation may be used such as a spatial light modulator optically responsive to ultraviolet, visible, or infrared radiation. Plate 102 is bumped (the "primary" bump) with from 0% to 100% of the requisite total bump power, typically 80%. Simultaneously, plate 100 that was bumped in a prior cycle is again bumped (the "secondary" bump) followed immediately by a pattern exposure with laser raster output scanner 112. In one embodiment as shown in this figure, the rasterized pattern exposure trails the "secondary" bump by about 3 inches in the direction of motion of the plate transfer. The "secondary" bump is from 0% to 100% of the requisite total bump power but is typically less than 25% of the "primary" bump power. In FIG. 3B, the bumped and patterned plate 100 is transferred away from the exposure station to the plate processing station. In FIG. 3C, an unexposed plate 106 is transferred from the in-feed to the vacuum platen 104. In FIG. 3D, the bump and pattern exposures are reversed from FIG. 3A. Plate 106 is bumped (the "primary" bump) with from 0% to 100% of the requisite total bump power. Simultaneously, plate 102 that was bumped in a prior cycle (FIG. 3B) by bump optics 110 is again bumped (the "secondary" bump) followed immediately by a pattern exposure with laser raster output scanner 112. In FIG. 3E, the bumped and patterned plate 102 is transferred away from the exposure station to the plate processing station. In FIG. 3F, an unexposed plate 106 is transferred from the in-feed to the vacuum platen 104. And in FIG. 3G, the entire cycle repeats with new plates 106 and 108 on the vacuum platen 104 while plates 116 and 118 wait in the queue. Thus, it is shown that a staggered plate transfer method coupled with an alternating bumping and patterning method yields the highest throughput for an automated UV photopolymer flexo CTP system.

Figure 4:
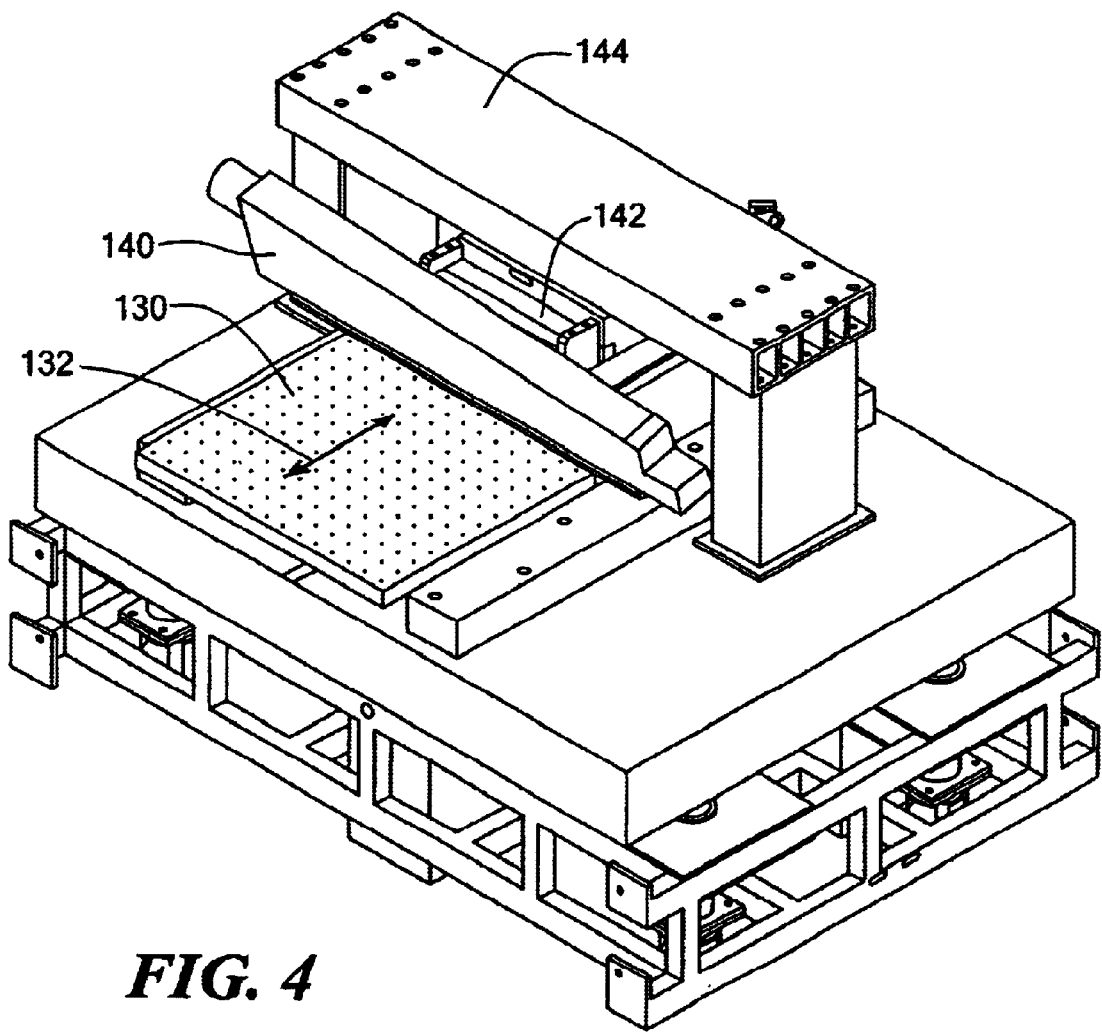
FIG. 4 is a schematic three-dimensional view of one embodiment of a system in accordance with the subject invention.
Figure 5:
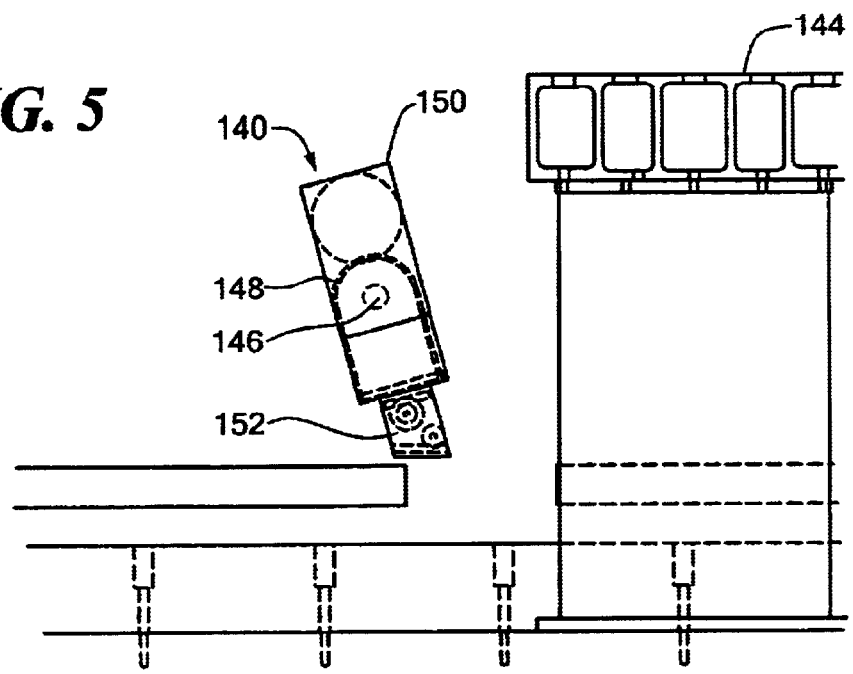
FIG. 5 is a schematic side view showing in more detail the linear lamp bump assembly shown in FIG. 4.

In one embodiment as shown in FIGS. 4 and 5, the conveyance mechanism which provides relative motion between the plate and both the band of bumping radiation and the modulated and rasterized imaging beam or beams includes vacuum platen 130 robotically movable in the direction shown by vector 132. This direction of motion is transverse to the length of the cross-wise band of bumping radiation. The ultraviolet bumping band is produced by linear lamp assembly 140 such as a long arc metal halide lamp and the exposure module optics assembly is shown at 142 beneath mount 144. Typically, a UV laser, not shown, in combination with the optical assembly produces rasterized beam or beams or, a spatial light modulator can be used. In the embodiment of FIG. 5, lamp 146 is located at a focal point of concave reflector 148 in housing 150. Electromechanical shutter assembly 152 contains two independent blades so that in the case where two plates are placed on platen 130, the side with the blade in the open position permits one plate to be bumped while the other side with the closed blade prevents errant light from exiting housing 150 and inadvertently exposing the other plate. In this case, one plate is bumped and imaged as shown with reference to FIGS. 2A–2L and the other plate is fully bumped but not imaged until patterning of the first plate is completed and after patterning optics 142 moves into position over the second plate. Shutter assembly 152 is useful because the length of time to warm up linear lamp 140 prevents electrical shuttering of linear lamp bump assembly 140. In other words, linear lamp bump assembly 140 is not turned off between exposures of individual plates.

Figure 6:
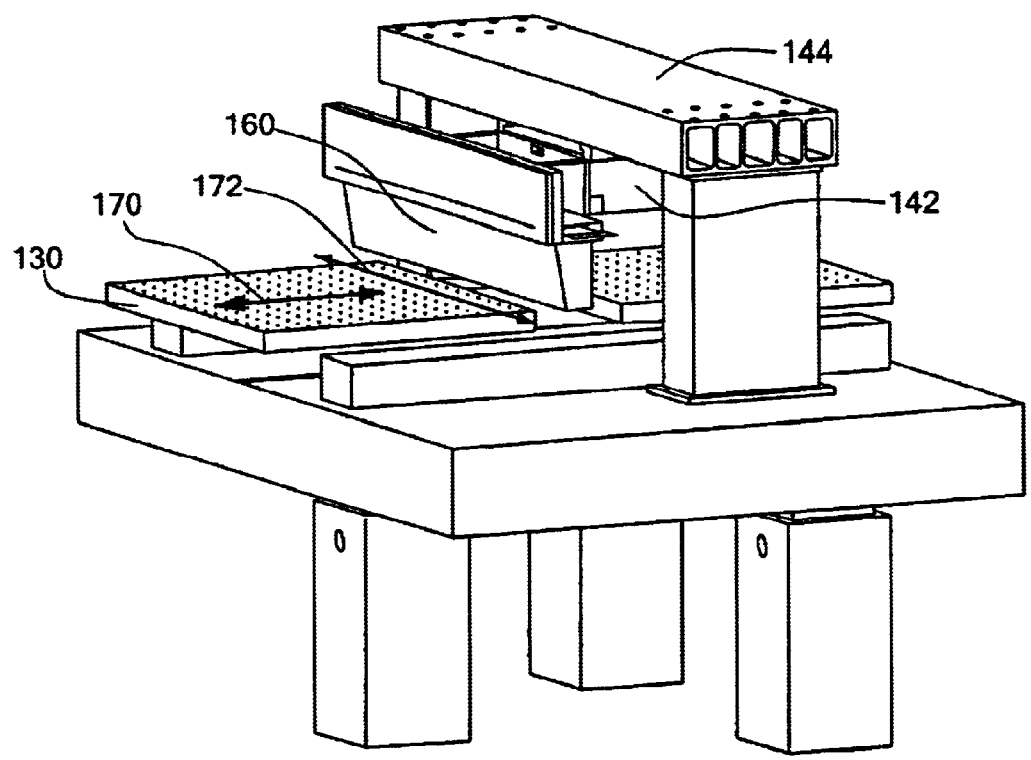
FIG. 6 is a schematic three-dimensional view showing one embodiment of a system in accordance with the subject invention.
Figure 7:
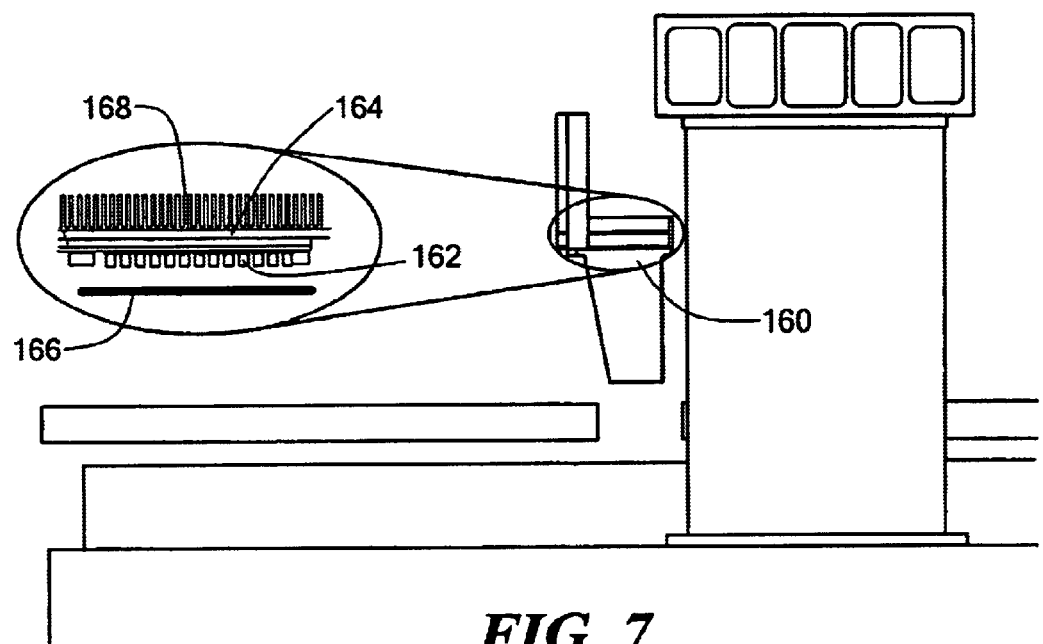
FIG. 7 is a schematic side view showing in more detail the LED bump assembly shown in FIG. 6.
Figure 8:
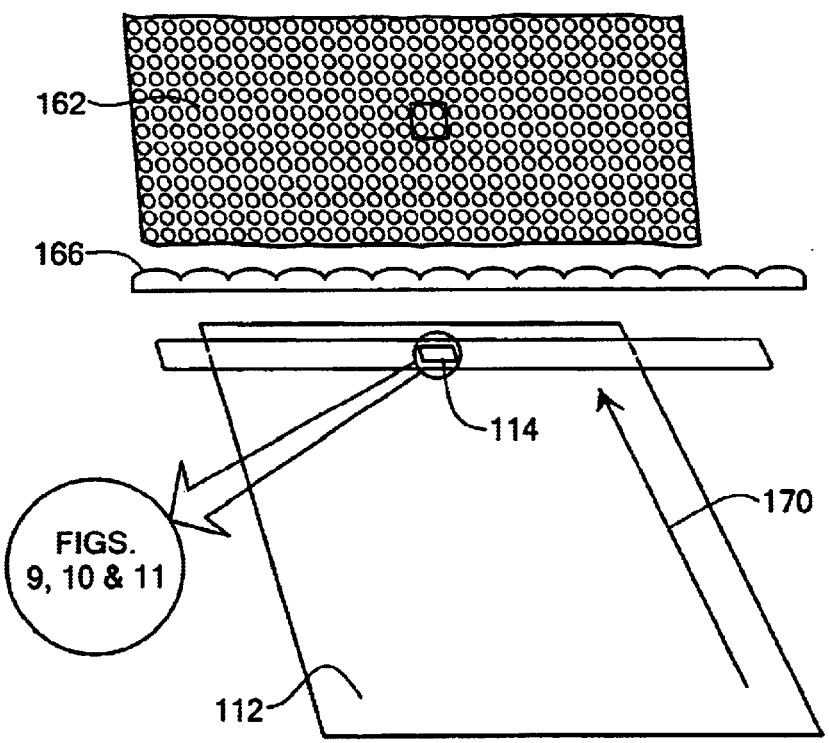
FIG. 8 is another highly schematic view showing the combination of an offset LED array and a lenticular lens in accordance with the embodiment of the subject invention shown in FIG. 6 and 7.

In another embodiment shown in FIGS. 6 and 7, the bumping band of illumination is provided by LED bump assembly 160, FIG. 6 which includes LED array 162, FIG. 7 mounted to circuit board mounting plate 164 above a diffusing mechanism such as a lenticular array 166. Heat sink 168 may also be provided. Preferably, as shown in FIG. 8, the rows of LED array 162 are staggered to yield the desired overlap. The LEDs in each row are uniformly spaced and the number of columns of the LED array sets the width of the bump. For this type of non-imaging bump, the width of the bump is greater than the width of the patterning raster scan line(s). The LED pitch and number of rows is determined by the desired fluence of energy density at the target. To correct for non-uniform illumination caused by the discrete nature of the LED array, especially if the array is located in close proximity to the printing plate 112 to be bumped, lenticular lens 166, FIG. 8 is placed between array 162 and the plate located at the image plane. Lenticular lens 166 is oriented with no optical power in the direction of motion 170 of the printing plate so that the irradiance orthogonal to the direction of motion 172 of the printing plate is spread out and integrated. The pitch and amplitude of the lenticular lens array determines the horizontal ripple in the projected fluence field prior to any additional electro-optical fine-tuning of the LED array. Control over each LED, or at a minimum control over each column of LEDs, permits electronic shuttering of the LED array when exposure is not desired, control of the average fluence, a fine-tune equalization of the fluence across the optical field, and the primary and secondary bump bands shown in FIG. 2.

As the printing plate 112 is moved underneath the LED array, any one point on the plate is exposed to the cumulative (integrated) fluence of the multiple rows of the LED array. The fluence is preferably integrated in both axes to typically yield less than 5% non-uniformity over the two-dimensional fluence field. A typical high sensitivity ultraviolet sensitive flexo plate requires a bump fluence of about 2–20 mJ/cm$^2$ at a wavelength between 365 nm and 436 nm, the effect of reduced oxygen inhibition lasts for approximately 10–100 seconds on a typical 15 mil thick flexo photopolymer resin as measured from the beginning of the application of the bump, and at least 2–20 seconds should elapse from the start of the bump process to the application of the pattern exposure.

Figure 9:
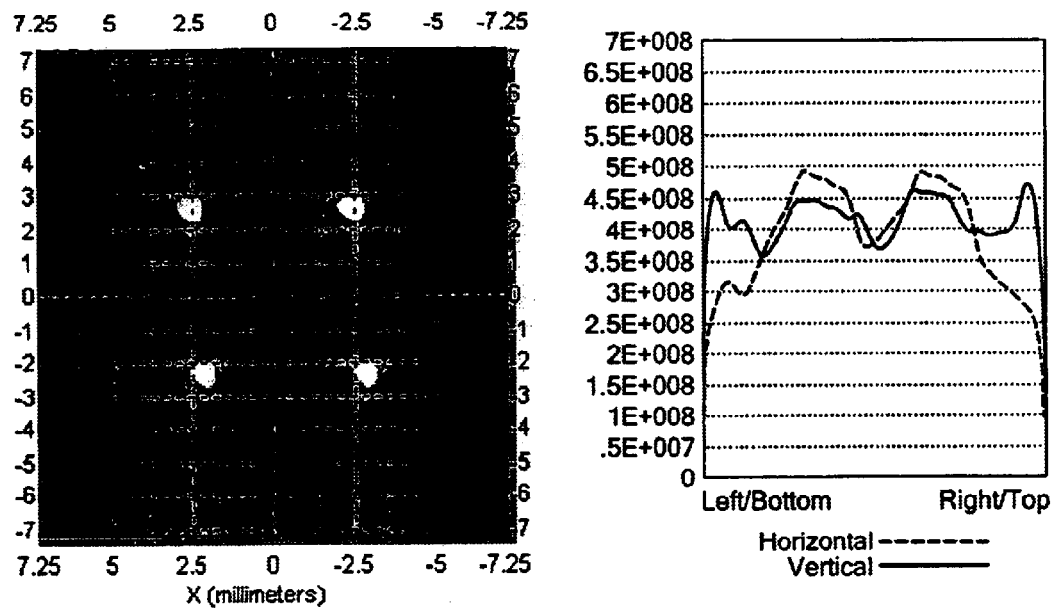
FIGS. 9–11 are fluence maps corresponding to the combination shown in FIG. 8.
Figure 10:
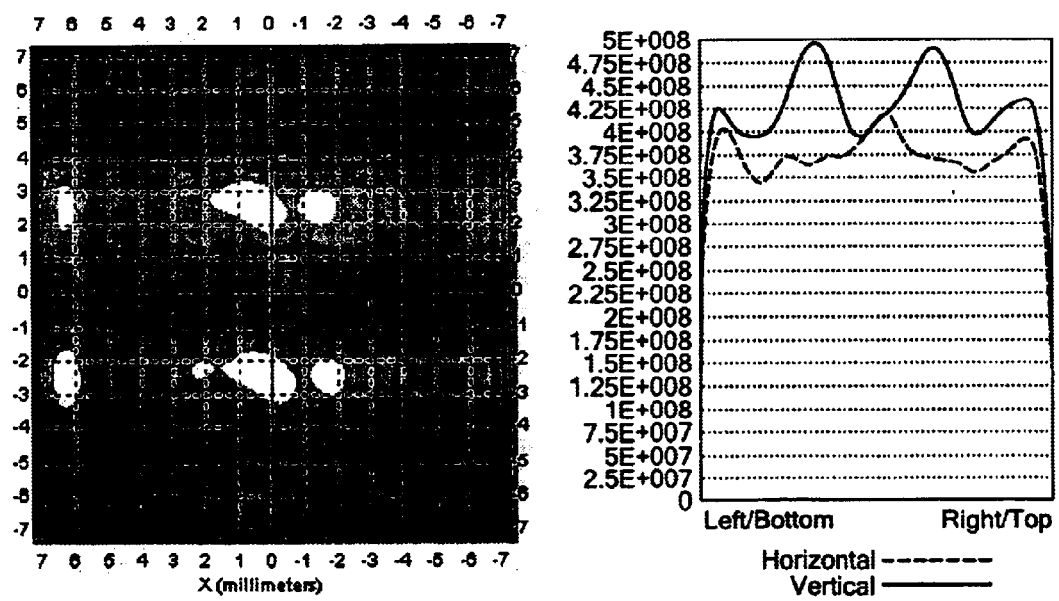
Figure 11:
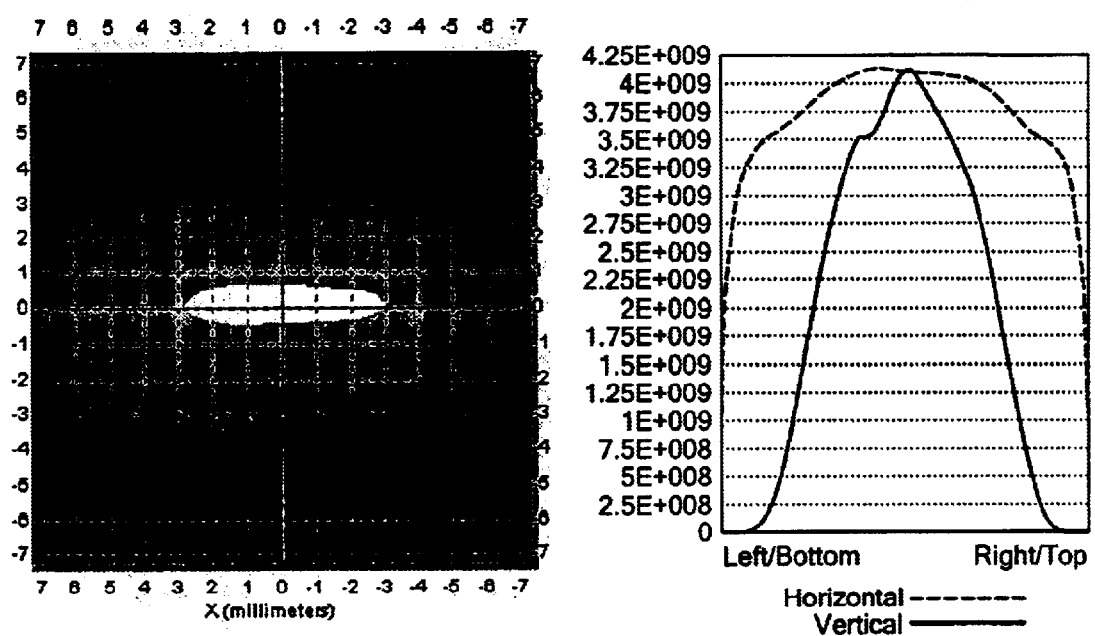

FIG. 9 is a fluence map at the image plane/printing plate of four adjacent LEDs. FIG. 10 is a fluence map at the image plane/printing plate of four adjacent LEDs after passing through lenticular lens array 166. FIG. 11 is a fluence map at the image plane/printing plate of four adjacent LEDs after passing through lenticular lens array 66 and after the forward integrating motion of the printing plate.

Typically, conveyance mechanism 130, FIGS. 4 and 6 operates at a continuous speed sufficient to effect exposing by the rasterized beam or beams, or an array of light produced by an illuminated and re-imaged spatial light modulator array, within 10–60 but no sooner than 5–20 seconds after the primary bumping for each portion of the plate, depending upon the photopolymer resin.

In another embodiment, lenticular lens 166, FIG. 8 is followed by an imaging lens to project an image of a rectangular mask illuminated by a homogenized and equalized ultraviolet or near ultraviolet source to create an illumination band with sharply defined edges at the image plane co-located at the surface of the printing plate or substrate. A sharp-edged bump permits the seamless tiling of subimages to form a larger image thereby permitting the exposure of plates that are wider than the band of illumination emitted by the bump.

In another embodiment, lenticular lens 166 is followed by a spatial light modulator instead of the rectangular mask above to permit the electro-optical modulation of an ultraviolet or near-ultraviolet light source to create an illumination band with sharply defined edges at the image plane co-located at the surface of the printing plate or substrate.

Thus the method of enhancing the exposure of photosensitive material in accordance with the subject invention includes providing a band or bands of illumination sufficient to consume dissolved oxygen within the photosensitive layer of the printing plate, providing a modulated and rasterized beam or beams of electromagnetic radiation, or an array of light produced by an illuminated and re-imaged spatial light modulator array, downstream of the band(s) of bump illumination, providing relative motion between the plate coated with photosensitive material and both the band(s) of illumination and the modulated and rasterized beam(s) or spatial light modulated array of light, and bumping one portion of the plate or an adjacent plate with a wide band of illumination and imaging the bumped portion with the modulated and rasterized beam(s) or spatial light-modulated array of light while simultaneously bumping another portion of the plate or an adjacent plate with the band(s) of bumping illumination. In this way, each portion of the plate, or each plate, is bumped and thereafter imaged in a continuous process in a single machine.

In the prior art, the '825 patent discloses bumping followed by the imaging but requires the use of a laser beam split into two distinct beams resulting in a higher cost system due to the requirement of a more powerful laser source. The '416 patent discloses a linear LED arrangement to preexpose the printing plate but fails to disclose and suggest anything about sequencing. In all likelihood, the whole printing plate is fully bumped and then transferred to an imagewise exposure machine.

In the subject invention, in contrast, an integrated in-line bumping and exposure system is effected which uses a low cost optical exposure source for bumping thereby conserving potentially expensive optical power for the pattern exposure process. In-line exposures of flexo newspaper plates are faster because of the configuration of the plate conveyance system to stagger the bumping and patterning processes. And plate image quality is higher because of a two-phase pre-exposure system that tailors the oxygen concentration throughout the resin cross section prior to the pattern exposure.

The subject invention thus may employ a linear lamp, such as a long arc metal halide lamp or an LED array, in non-imaging optical configurations to bump the plate with UV or near-UV light prior to pattern exposure. Patterning is via either a modulated laser raster scanner or array of light produced by an illuminated and re-imaged spatial light modulator array. The fluence footprint typically has very unsharp, fuzzy edges.

Alternatively, a lamp (e.g., a linear or point source, long or short arc, etc.) or array of LEDs, is used in an imaging configuration, to bump with very sharp edges. This is useful for plates larger than the bump because larger plates need to be exposed continuously in stripes or piecewise in blocks. A fuzzy-edged bump optically contaminates adjacent portions of the printing plate whereas a sharp-edged bump permits the seamless tiling of bumped subimages to form a larger bumped image.

The subject invention employs a plate chemistry dependent delay between the bump and pattern exposure to provide time for the process of photometric consumption of oxygen to reach chemical equilibrium. The subject invention matches a linear bump to a linear scan or an area bump to an area scan to observe the requirement for constant delay from bump to primary exposure to achieve uniform image quality. The in-feed and out-feed can be staggered in the case of two or more printing plates to accommodate the plate-dependent delay between bump and pattern exposure. When appropriate or necessary, a first and second bump are applied: the first bump consumes bulk oxygen dissolved throughout the flexo plate and the second bump, applied after the built-in delay and just before the pattern exposure, consumes oxygen that has penetrated the top layer of the resin. This performs a fine-tuning of the oxygen profile to obtain the best exposed feature profile.

A lenticular lens optically and statically integrates the LED bump fluence orthogonal to the direction of relative motion of the bump and the plate. The relative motion of the bump and the plate mechanically and dynamically integrates the fluence in the slow scan direction.

Separate bumping and patterning sources permit different wavelengths for bump and pattern exposure. Separate sources for bump and pattern exposure are beneficial if the pattern exposure source is a very expensive laser where optical power is at a premium.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims:

What is claimed is:

1. An integrated, in-line bumping and exposure system for printing plates or other substrates having a photosensitive layer, the system comprising:
   a linear illumination source for bumping the photosensitive material with a band of illumination to consume any dissolved oxygen within the photosensitive layer;
   an exposure module for exposing the photosensitive material with electromagnetic radiation located directly downstream of the band of bumping illumination; and
   a conveyance mechanism configured to provide relative motion between the plate and the band of illumination and the electromagnetic radiation to continuously bump one portion of the plate and image the bumped portion of the plate while another portion of the plate is being bumped.

2. The system of claim 1 in which the illumination source is a source of ultraviolet, visible, or infrared radiation having a wavelength of between 200 nm and 1100 nm.

3. The system of claim 2 in which the illumination source includes an ultraviolet, visible, or infrared emitting lamp or an array of lamps at a focal point of a concave reflector.

4. The system of claim 3 further including a shutter assembly for selectively blocking the output of the lamp.

5. The system of claim 1 in which the raster scan optical assembly is optically responsive to an ultraviolet, visible, or infrared laser.

6. The system of claim 1 in which the conveyance mechanism includes a platen which moves the plate under the linear illumination source and the exposure module.

7. The system of claim 2 in which the illumination source includes an LED array.

8. The system of claim 7 in which the rows of LEDs are staggered.

9. The system of claim 7 in which the illumination source includes a diffusing mechanism.

10. The system of claim 9 in which the diffusing mechanism is a lenticular lens for spatially integrating the fluence of the array.

11. The system of claim 9 in which the lenticular lens is oriented to have a minimum of optical power in the direction of relative motion.

12. The system of claim 1 in which the conveyance mechanism operates at a continuous speed.

13. The system of claim 1 in which the conveyance mechanism operates at a speed sufficient to effect exposing within 10–100 seconds of bumping for each portion of the plate.

14. The system of claim 1 in which the conveyance mechanism operates at a speed sufficient to effect exposing no sooner than within 2–20 seconds of bumping for each portion of the plate.

15. The system of claim 1 in which the width of the illumination beam is greater than or equal to the width of scan lines provided by the exposure module.

16. The system of claim 1 in which the exposure module includes a raster scan optical assembly.

17. The system of claim 1 in which the exposure module includes a spatial light modulator.

18. A method of enhancing the exposure of photosensitive material, the method comprising:
   providing a band of illumination sufficient to consume any dissolved oxygen within the photosensitive material;
   providing electromagnetic radiation directly downstream of the band of bump illumination to image the material;
   providing relative motion between the material and the band of bumping illumination and the electromagnetic radiation; and
   bumping one portion of the plate with the band of bumping illumination and imaging the bumped portion with the electromagnetic radiation while bumping another portion of the plate with the band of bumping illumination.

19. The method of claim 18 in which the band of illumination is ultraviolet, visible, or infrared radiation having a wave length of between 200 nm and 1100 nm.

20. The method of claim 18 in which the band of illumination originates from an ultraviolet, visible, or infrared emitting lamp at a focal point of a concave reflector.

21. The method of claim 20 further including a shutter assembly for selectively blocking the output of the lamp.

22. The method of claim 18 in which the band of illumination originates from an LED array.

23. The method of claim 22 in which the rows of LEDs are staggered.

24. The method of claim 22 further including diffusing the LED illumination.

25. The method of claim 22 in which a lenticular lens is used to spatially integrate the fluence of the LED array.

26. The method of claim 22 in which a scattering optical diffuser is used to spatially integrate the fluence of the LED array.

27. The method of claim 25 in which the lenticular lens is oriented to have a minimum of optical power in the direction of relative motion.

28. The method of claim 18 in which the relative motion is at a continuous speed.

29. The method of claim 18 in which relative motion is at a speed sufficient to effect exposing within 10–100 seconds of bumping for each portion of the plate.

30. The method of claim 18 in which the relative motion is at a speed sufficient to effect exposing no sooner than 2–20 seconds of bumping for each portion of the plate.

31. A method of enhancing the exposure of photosensitive material on a printing plate or other substrate, the method comprising:
   bumping one portion of the plate with a band of bumping illumination sufficient to consume any dissolved oxygen within the photosensitive material;
   imaging the bumped portion with electromagnetic radiation; and
   bumping another portion of the plate with the band of bumping illumination in a continuous process so that bumping of one portion of the plate occurs simultaneously while another portion of the plate is being imaged.

32. An integrated, in-line bumping and exposure system for printing plates or other substrates having a photosensitive layer, the system comprising:
   a linear illumination source including a linear lamp producing ultraviolet, visible, or infrared radiation having a wavelength of between 200 nm and 1100 nm for bumping the photosensitive material with a band of illumination to consume any dissolved oxygen within the photosensitive layer;
   a raster scan optical assembly or a spatial light modulator based exposure module for exposing the photosensitive material with a rasterized beam or beams or a spatially modulated array of electromagnetic radiation located directly downstream of the band of bumping illumination; and a conveyance mechanism configured to provide relative motion between the plate and the band of illumination and the rasterized beam or beams or a spatially modulated array of electromagnetic radiation to continuously bump one portion of the plate and image the bumped portion of the plate while another portion of the plate is being simultaneously bumped.

33. An integrated, in-line bumping and exposure system for printing plates or other substrates having a photosensitive layer, the system comprising:

an LED array with rows of staggered LEDs and a diffusing mechanism for bumping the photosensitive material with a band of illumination to consume any dissolved oxygen within the photosensitive layer;

a raster scan optical assembly or a spatial light modulator based exposure module for exposing the photosensitive material with a rasterized beam or beams or a spatially modulated array of electromagnetic radiation located directly downstream of the band of bumping illumination; and a conveyance mechanism configured to provide relative motion between the plate and the band of illumination and the rasterized beam or beams or a spatially modulated array of electromagnetic radiation to continuously bump one portion of the plate and image the bumped portion of the plate while another portion of the plate is being bumped.

34. An integrated, in-line bumping and exposure system for printing plates or other substrates having a photosensitive layer, the system comprising:

a linear illumination source for bumping the photosensitive material with a band of illumination to consume any dissolved oxygen within the photosensitive layer;

a raster scan optical assembly or a spatial light modulator based exposure module for exposing the photosensitive material with a rasterized beam or beams or a spatially modulated array of electromagnetic radiation directly downstream of the band of bumping illumination; and a conveyance mechanism operating at a continuous speed and configured to provide relative continuous motion between the plate and the band of illumination and the rasterized beam or beams or a spatially modulated array of electromagnetic radiation to continuously bump one portion of the plate and image the bumped portion of the plate while another portion of the plate is simultaneously being bumped.

35. A method of enhancing exposure of photosensitive material on a printing plate or other substrate, the method comprising:

bumping a first portion of the plate with a band of primary bumping illumination sufficient to consume any dissolved oxygen within the photosensitive material;

bumping said first portion of the plate with a band of secondary bumping illumination sufficient to consume any oxygen re-diffused within the photosensitive material after the primary bump; and imaging said first portion to expose it.

36. The method of claim 35 further including bumping a second portion of the plate with the band of primary bumping illumination while first portion of the plate is subjected to said secondary bump and imaging.

37. The method of claim 35 in which the time between imaging and the primary bump is greater than the time between imaging and the secondary bump.

38. The method of claim 37 in which the time between the primary bump and the secondary bump is greater than 5 seconds.

39. The method of claim 35 in which the primary and the secondary bump illumination are produced by the same illumination source.

40. An in-line bumping and exposure system for printing plates or other substrates having a photosensitive layer, the system comprising:

a source of primary bumping radiation for bumping the photosensitive material to consume any dissolved oxygen within the photosensitive layer;

a source of secondary bumping radiation for bumping the photosensitive material to consume any oxygen re-diffused within the photosensitive material;

a source for exposing the photosensitive material; and a mechanism for providing relate motion between a plate and the source of primary bumping radiation, the source of secondary bumping radiation, and the exposure source.

41. The method of claim 40 in which the source of primary bumping radiation and the source of secondary bumping radiation is an LED array.

42. The method of claim 41 in which the optical power of the primary bumping radiation is greater than the optical power of secondary bumping radiation.

43. The system of claim 40 in which the source of primary bumping radiation and the source of secondary bumping radiation is an ultraviolet, visible, or infrared emitting lamp.

44. The system of claim 43 in which the optical power of the primary bumping radiation is greater than the optical power of the secondary bumping radiation.

45. The system of claim 43 in which the optical power of the primary bumping radiation is less than or equal to the optical power of the secondary bumping radiation.

46. The system of claim 40 in which the source of primary bumping radiation and the source of secondary bumping radiation is an ultraviolet, visible, or infrared emitting laser.

47. The system of claim 46 in which the optical power of the primary bumping radiation is greater than the optical power of the secondary bumping radiation.

48. The system of claim 46 in which the optical power of the primary bumping radiation is less than or equal to the optical power of the secondary bumping radiation.

49. The system of claim 40 in which the source of primary bumping radiation is an ultraviolet, visible, or infrared emitting lamp and the source of secondary bumping radiation is an ultraviolet, visible, or infrared emitting laser.

50. The system of claim 49 in which the optical power of the primary bumping radiation is greater than the optical power of the secondary bumping radiation.

51. The system of claim 46 in which the optical power of the primary bumping radiation is less than or equal to the optical power of the secondary bumping radiation.

* * * * *